(12) United States Patent
Chuang et al.

(10) Patent No.: US 12,021,150 B2
(45) Date of Patent: Jun. 25, 2024

(54) TRANSISTOR STRUCTURE HAVING IMPROVED ELECTRODE CONDUCTANCE AND METHOD FOR MANUFACTURING THE SAME

(71) Applicant: TAIWAN SEMICONDUCTOR MANUFACTURING COMPANY, LTD., Hsinchu (TW)

(72) Inventors: Ming-Yen Chuang, Hsinchu (TW); Katherine H. Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 64 days.

(21) Appl. No.: 17/737,504

(22) Filed: May 5, 2022

(65) Prior Publication Data

US 2023/0361216 A1    Nov. 9, 2023

(51) Int. Cl.
*H01L 29/786* (2006.01)
*H01L 29/10* (2006.01)
*H01L 29/417* (2006.01)
*H01L 29/49* (2006.01)
*H01L 29/66* (2006.01)

(52) U.S. Cl.
CPC .... *H01L 29/78606* (2013.01); *H01L 29/1037* (2013.01); *H01L 29/41733* (2013.01); *H01L 29/4908* (2013.01); *H01L 29/66765* (2013.01)

(58) Field of Classification Search
CPC ........... H01L 29/78606; H01L 29/1037; H01L 29/41733; H01L 29/4908; H01L 29/66765
See application file for complete search history.

(56) References Cited

U.S. PATENT DOCUMENTS

2018/0294361 A1* 10/2018 An .................. H01L 27/124

* cited by examiner

*Primary Examiner* — Mohammed R Alam
(74) *Attorney, Agent, or Firm* — Birch, Stewart, Kolasch & Birch, LLP

(57) ABSTRACT

A semiconductor device includes a substrate and a transistor structure disposed on the substrate. The transistor structure includes a channel region and a source/drain electrode disposed on the channel region. The channel region includes a lower channel portion and a plurality of upper channel portions protruding from the lower channel portion into the source/drain electrode to form an uneven interface between the channel region and the source/drain electrode.

20 Claims, 13 Drawing Sheets

TRANSISTOR STRUCTURE HAVING IMPROVED ELECTRODE CONDUCTANCE AND METHOD FOR MANUFACTURING THE SAME

BACKGROUND

Thin film transistor (TFT) is a kind of metal-oxide-semiconductor field effect transistor (MOSFET), and may be used in a flat panel display as a switching transistor and in a static random access memory as a load device. A potential barrier is formed at an interface of an electrode (for example, a source/drain electrode) and an active layer (a metal oxide layer, for example, a channel region) of the transistor due to Fermi level alignment, which might impact the conductance of the electrode. When an electric field is applied, the potential barrier can be reduced and the transistor can be turned on accordingly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
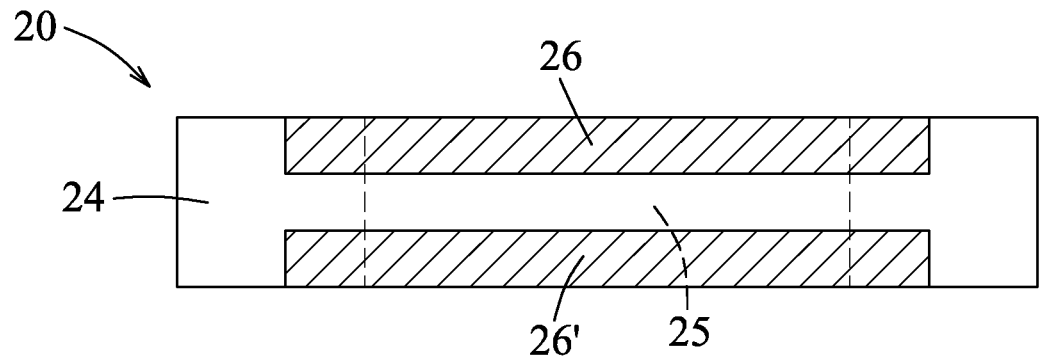
FIG. 1 is a schematic top view of a transistor structure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "upper," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
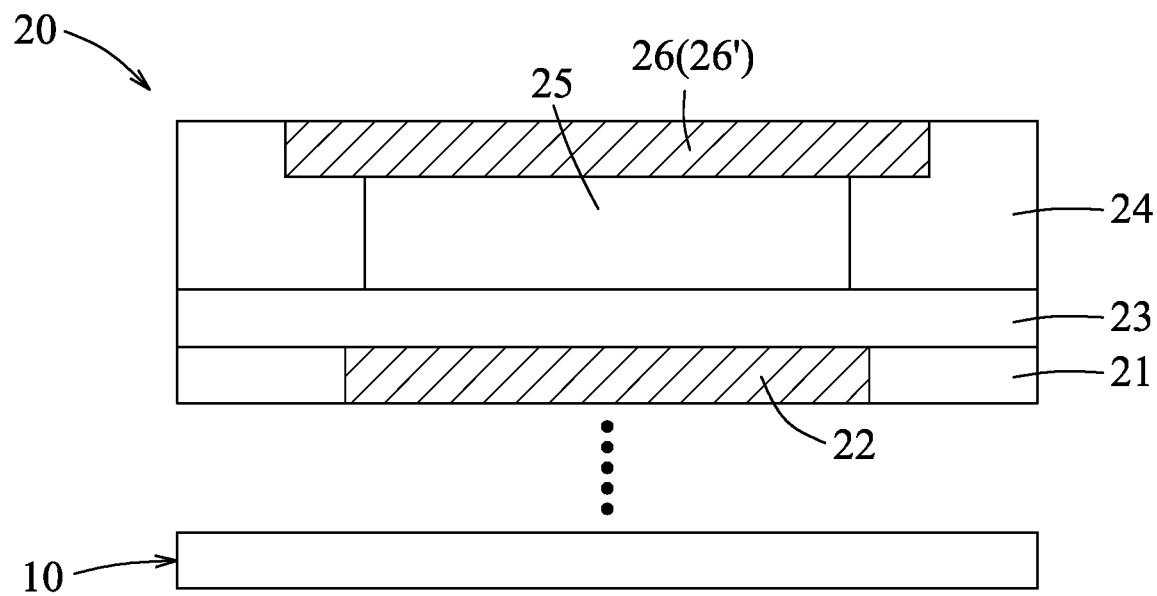
FIG. 2 is a schematic side view of the transistor structure disposed on a substrate.

FIG. 1 is a schematic top view of a transistor structure 20. FIG. 2 is a schematic side view of the transistor structure 20 disposed on a substrate 10. The transistor structure 20 is a thin film transistor (TFT) structure having a back gate configuration, and includes a first dielectric layer 21, a gate electrode 22, a high-k gate insulator layer 23, a second dielectric layer 24, a channel region 25, a first source/drain electrode 26, and a second source/drain electrode 26'. The first dielectric layer 21 is formed on the substrate 10. The gate electrode 22 is formed in the first dielectric layer 21 and on the substrate 10. The high-k gate insulator layer 23 is formed on the first dielectric layer 21 and the gate electrode 22. The second dielectric layer 24 is formed on the high-k gate insulator layer 23. The channel region 25 is formed in a lower portion of the second dielectric layer 24 and on the high-k gate insulator layer 23, and is isolated from the gate electrode 22 by the high-k gate insulator layer 23. Each of the first and second source/drain electrodes 26, 26' is formed in an upper portion of the second dielectric layer 24 and on the channel region 25.

Figure 3:
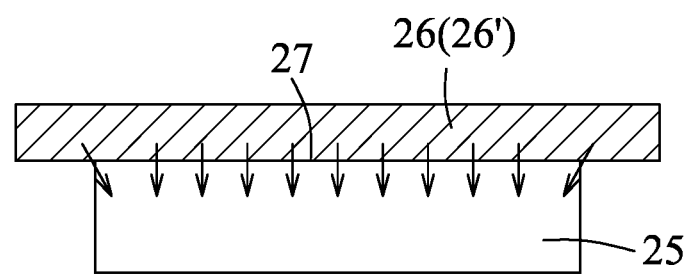
FIG. 3 is a schematic side view illustrating an electric field distribution at an interface of an electrode (for example, a source/drain electrode) and an active layer (a metal oxide layer, for example, a channel region) of the transistor structure illustrated in FIGS. 1 and 2.

FIG. 3 is a schematic side view illustrating an electric field distribution at a planar interface 27 of the first or second source/drain electrodes 26, 26' and the channel region 25 (i.e., an active layer (a metal oxide layer)) of the transistor structure 20. The electric field distribution is indicated by arrows in FIG. 3. It has been known that a potential barrier is formed at an interface (e.g., the planar interface 27) of an electrode (e.g., the first or second source/drain electrodes 26, 26') and an active layer (a metal oxide layer, for example, the channel region 25) of a transistor structure due to Fermi level alignment, which may impact the conductance of the electrode. When an electric field is applied, the potential barrier can be reduced and the transistor structure can be turned on accordingly. Therefore, the performance of a transistor structure can be improved by increasing an effective electric field at an interface of the electrode and the active layer so as to reduce the contact resistance at the interface and to increase the electrode conductance.

Figure 4:
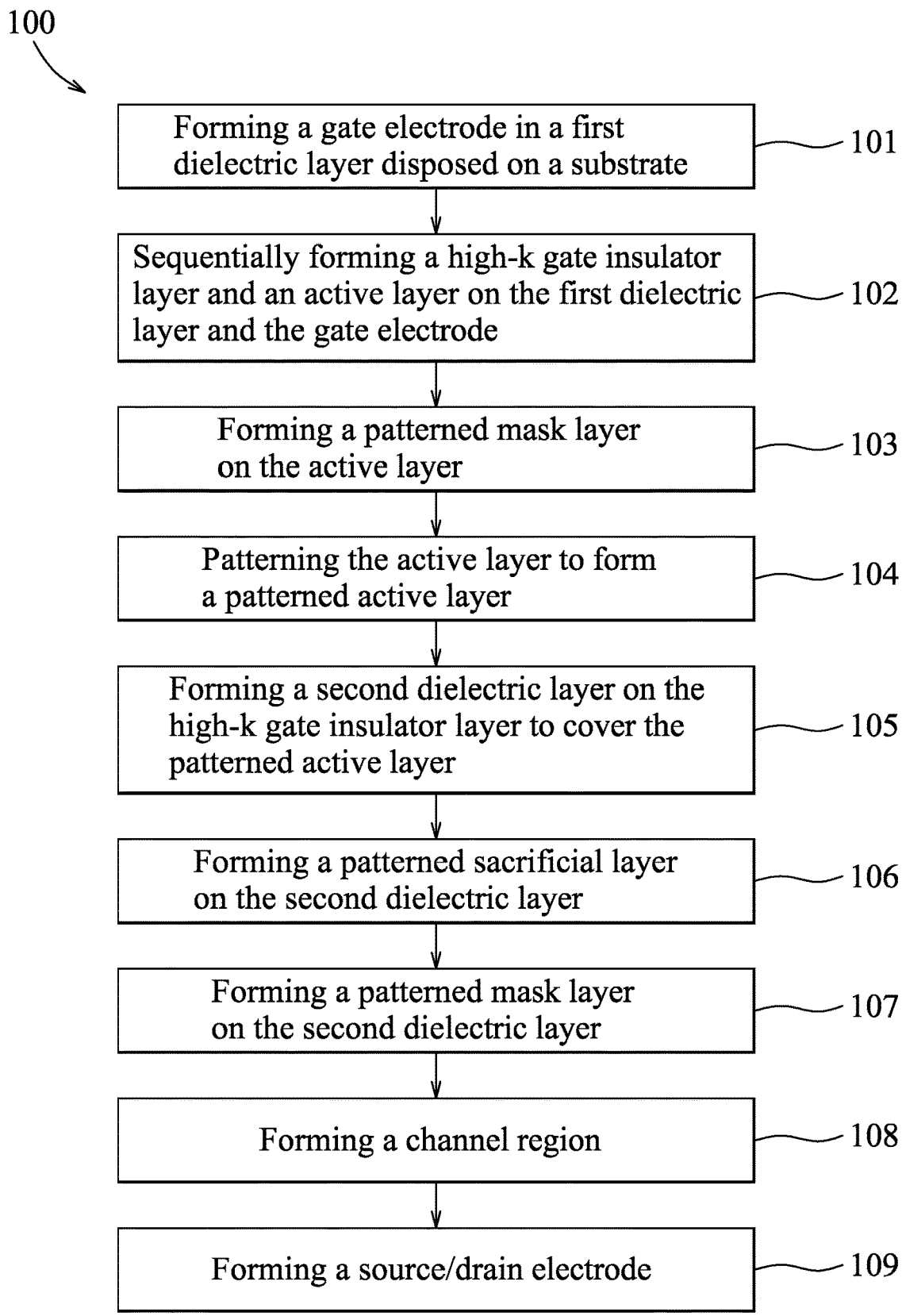
FIG. 4 is a flow diagram illustrating a method for manufacturing a semiconductor device including a transistor structure in accordance with some embodiments.

The present disclosure is directed to a semiconductor device including a transistor structure formed with a novel electrode design to increase an effective electric field during operation of the transistor structure so as to increase the electrode conductance, and a method for manufacturing the same. FIG. 4 illustrates a method 100 for manufacturing a semiconductor device in accordance with some embodiments. FIGS. 5 to 14 are schematic views of a semiconductor device 30 at some intermediate stages of the manufacturing method as depicted in FIG. 4 in accordance with some embodiments. Additional steps can be provided before, after or during the method 100, and some of the steps described herein may be replaced by other steps or be eliminated. Similarly, further additional features may be present in the semiconductor device 30, and/or features present may be replaced or eliminated in additional embodiments.

Figure 5:
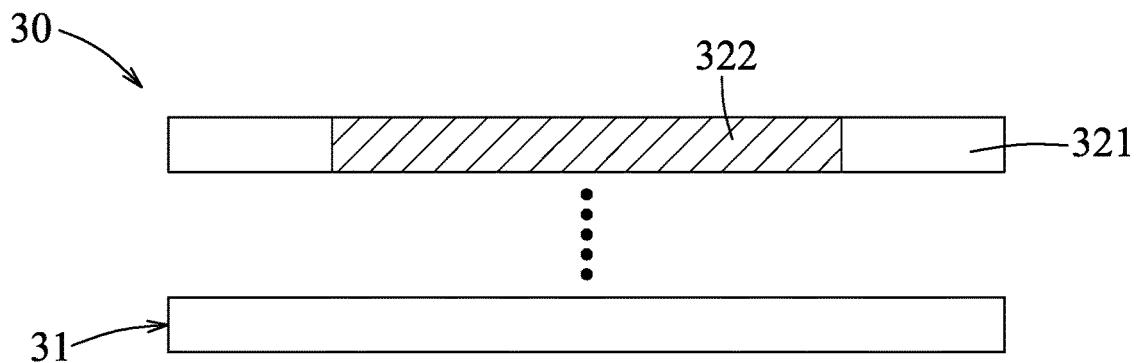
FIGS. 5 to 14 are schematic side views illustrating some intermediate stages of the manufacturing method as depicted in FIG. 4 in accordance with some embodiments.

Referring to FIG. 4 and the example illustrated in FIG. 5, the method 100 begins at step 101, where a gate electrode is formed in a first dielectric layer disposed on a substrate. As illustrated in FIG. 5, a first dielectric layer 321 is formed on the substrate 31. In some embodiments, the first dielectric layer 321 may include dielectric materials, such as silicon oxide (SiOx), silicon nitride (SiNx), silicon carbide (SiCx), silicon oxycarbide (SiOxCy), silicon oxynitride (SiOxNy), hydrogenated silicon oxycarbide (SiOxCyHz), spin-on glass (SOG), amorphous fluorinated carbon, fluorinated silica glass (FSG), Xerogel, Aerogel, polyimide, Parylene, BCB (bis-benzocyclobutenes), Flare, SiLK (Dow Chemical Co., Midland, Mich.), non-porous materials, porous materials, other low-k dielectric materials, or combinations thereof. Other suitable materials are within the contemplated scope of the present disclosure. In some embodiments, the first dielectric layer 321 may be deposited on the substrate 31 by a suitable deposition process as is known in the art of semiconductor fabrication, such as physical vapor deposition (PVD), chemical vapor deposition (CVD), atomic layer deposition (ALD), plasma-enhanced ALD (PEALD), thermal ALD, plasma-enhanced CVD (PECVD), or the like. Other suitable techniques are within the contemplated scope of the present disclosure.

In some embodiments, the substrate 31 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorus (P), or arsenic (As). Other suitable materials are within the contemplated scope of the present disclosure.

In some embodiments, a gate electrode 322 may be formed in the first dielectric layer 321 and on the substrate 31 by the following steps. A mask layer (for example, a hard mask layer, not shown) is deposited on the first dielectric layer 321. The mask layer may include, for example, but not limited to, silicon oxide, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof. Other suitable materials are within the contemplated scope of the present disclosure. The mask layer may be formed on the first dielectric layer 321 by a suitable deposition process as is known in the art of semiconductor fabrication, such as PVD, CVD, ALD, PEALD, thermal ALD, PECVD, or the like. Other suitable techniques are within the contemplated scope of the present disclosure. A photoresist layer (not shown) is then formed on the mask layer by a suitable fabrication technique known to those skilled in the art of semiconductor fabrication, for example, but not limited to, a spin-on technique. Other suitable techniques are within the contemplated scope of the present disclosure. The photoresist layer is then patterned using a suitable photolithography technique to form an opening pattern. For example, the photoresist layer is exposed to light for patterning, followed by developing to form the opening pattern. The mask layer is then patterned by transferring the opening pattern formed in the photoresist layer to the mask layer using an etching process, for example, but not limited to, a wet etching process, a dry etching process, a reactive ion etching process, a neutral beam etching process, or the like. After the opening pattern is transferred to the mask layer, the photoresist layer may be removed by, for example, but not limited to, an ashing process. The opening pattern formed in the mask layer is then transferred to the first dielectric layer 321 using a suitable etching process, for example, but not limited to, a wet etching process, a dry etching process, or the like, so as to form an opening extending through the first dielectric layer 321. Other suitable etching techniques are within the contemplated scope of the present disclosure. The gate electrode 322 is then formed in the first dielectric layer 321 and on the substrate 31 by depositing a conductive material to fill the opening and then removing excess of the conductive material over the first dielectric layer 321 by a planarization technique, such as chemical mechanical planarization (CMP). In some embodiments, the conductive material may include, for example, but not limited to, polysilicon, doped silicon, a metal silicide material, metal composites (for example, but not limited to, titanium nitride (TiN), tantalum nitride (TaN), tungsten nitride (WN), other metal nitrides, or the like, or combinations thereof), or a metal material (for example, but not limited to, silver, aluminum, copper, zirconium, titanium, tungsten, tantalum, ruthenium, palladium, platinum, cobalt, nickel, or the like, or alloys thereof). Other suitable materials are within the contemplated scope of the present disclosure. Deposition of the conductive material may be performed by a suitable deposition process as is known in the art of semiconductor fabrication, such as PVD, CVD, ALD, PEALD, thermal ALD, PECVD, or the like. Other suitable techniques are within the contemplated scope of the present disclosure.

Figure 6:
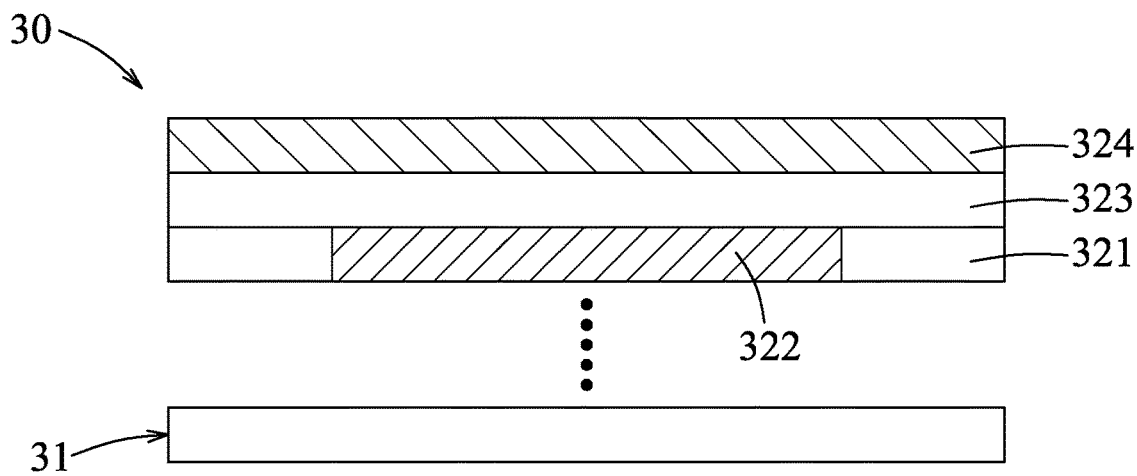

Referring to FIG. 4 and the example illustrated in FIG. 6, the method 100 then proceeds to step 102, where a high-k gate insulator layer and an active layer are sequentially formed on the first dielectric layer and the gate electrode. A high-k gate insulator layer 323 and an active layer (a metal oxide layer) 324 are sequentially formed on the first dielectric layer 321 and the gate electrode 322 by a suitable deposition process as is known in the art of semiconductor fabrication, such as PVD, CVD, ALD, PEALD, thermal ALD, PECVD, or the like. Other suitable techniques are within the contemplated scope of the present disclosure. In some embodiments, the high-k gate insulator layer 323 may include, for example, but not limited to, silicon oxide (SiOx), silicon nitride (SiNx), silicon oxynitride (SiOxNy), hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, zirconium oxide, titanium oxide, aluminum oxide ($Al_2O_3$), a hafnium dioxide-alumina ($HfO_2$—$Al_2O_3$) alloy, or combinations thereof. Other suitable materials are within the contemplated scope of the present disclosure. In some embodiments, the active layer 324 may include a metal oxide material, for example, but not limited to, indium gallium zinc oxide (InGaZnO, IGZO), tungsten-doped indium oxide (InWO), indium zinc oxide (InZnO), indium tin oxide (InSnO), zinc oxide (ZnO), gallium oxide (GaOx), indium oxide (InOx), aluminum zinc oxide (AZO), or combinations thereof. Other suitable materials are within the contemplated scope of the present disclosure.

Figure 7:
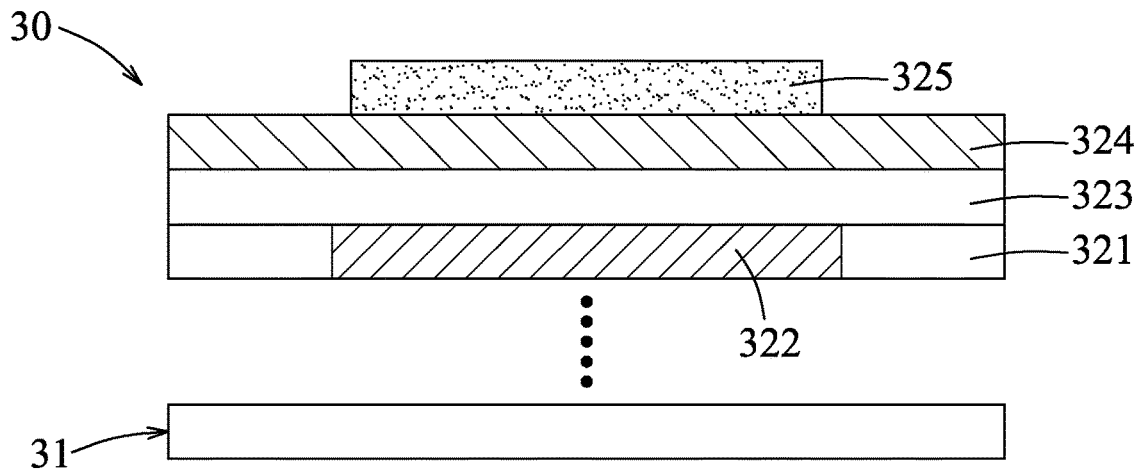

Referring to FIG. 4 and the example illustrated in FIG. 7, the method 100 then proceeds to step 103, where a patterned mask layer is formed on the active layer. A patterned mask layer 325 is formed on the active layer 324 using the materials and the processes described above for patterning the mask layer in the formation of the opening in the first dielectric layer 321 with reference to FIG. 5, and the details thereof are omitted for the sake of brevity.

Figure 8:
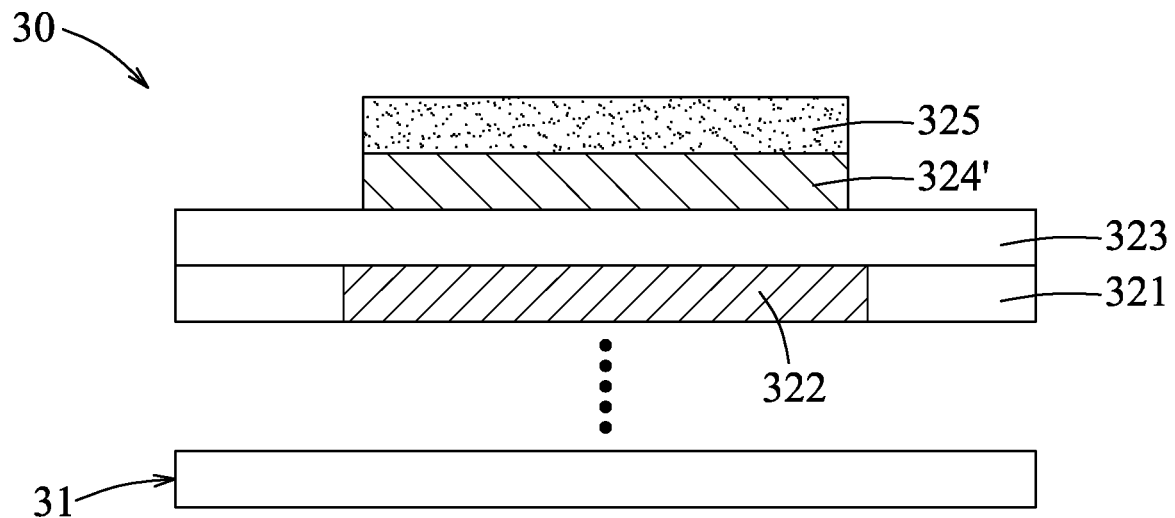
Figure 9:
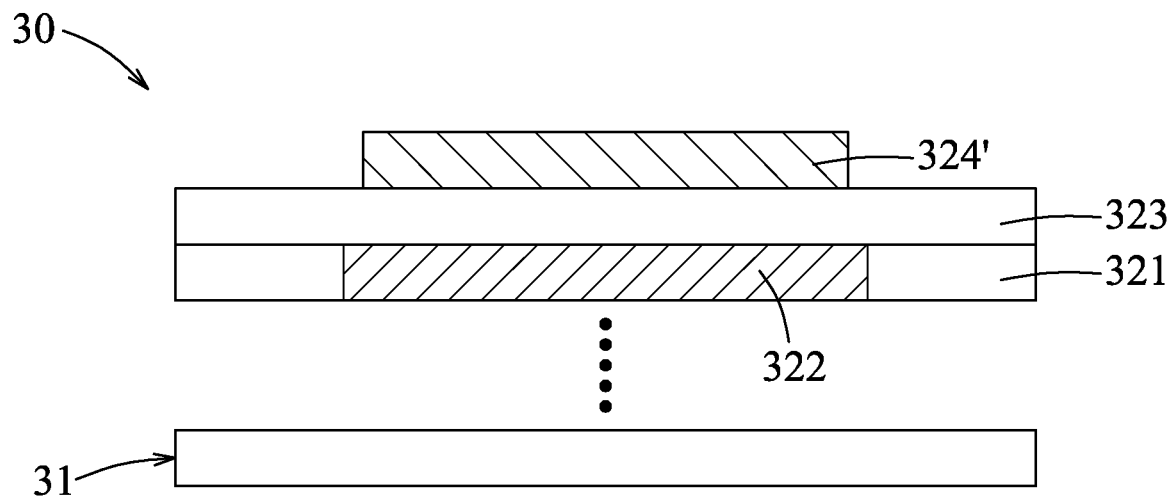

Referring to FIG. 4 and the examples illustrated in FIGS. 7 to 9, the method 100 then proceeds to step 104, where the active layer is patterned to form a patterned active layer. An opening pattern formed in the patterned mask layer 325 is then transferred to the active layer 324 using a wet etching process, so as to form a patterned active layer 324' on the high-k gate insulator layer 323. Thereafter, the patterned mask layer 325 may be removed by a suitable process, for example, but not limited to, a wet etching process, a dry etching process, or the like. In some alternative embodiments, the patterned active layer 324' may be formed using a dry etching process, in which the active layer 324 is patterned through the patterned mask layer 325 to form the patterned active layer 324' and the patterned mask layer 325 is gradually removed at the same time. That is, the stage illustrated in FIG. 8 is omitted when the dry etching process is used to form the patterned active layer 324'.

Figure 10:
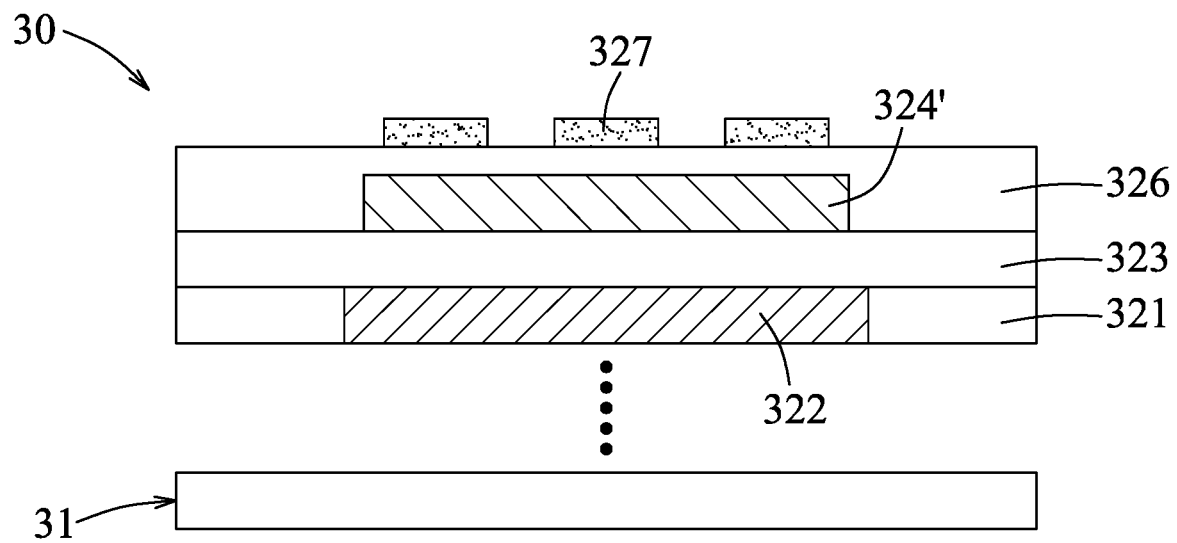

Referring to FIG. 4 and the example illustrated in FIG. 10, the method 100 then proceeds to step 105, where a second dielectric layer is formed on the high-k gate insulator layer to cover the patterned active layer. A second dielectric layer 326 is formed on the high-k gate insulator layer 323 by a suitable deposition process as is known in the art of semiconductor fabrication to cover the patterned active layer 324'. The material and the deposition process for forming the second dielectric layer 326 may be the same as or similar to those for forming the first dielectric layer 321 described above with reference to FIG. 5, and the details thereof are omitted for the sake of brevity.

Referring to FIG. 4 and the example illustrated in FIG. 10, the method 100 then proceeds to step 106, where a patterned sacrificial layer is formed on the second dielectric layer. A patterned sacrificial layer 327 is formed on the second dielectric layer 326 by the processes described above for patterning the mask layer in the formation of the opening in the first dielectric layer 321, and the details thereof are omitted for the sake of brevity. In some embodiments, the patterned sacrificial layer 327 may include silicon oxide (SiOx), silicon nitride (SiNx), silicon oxynitride (SiOxNy), silicon oxycarbide (SiOxCy), or the like, or combinations thereof. The patterned sacrificial layer 327 is disposed on the second dielectric layer 326 in a position corresponding to that of the patterned active layer 324'.

Figure 11:
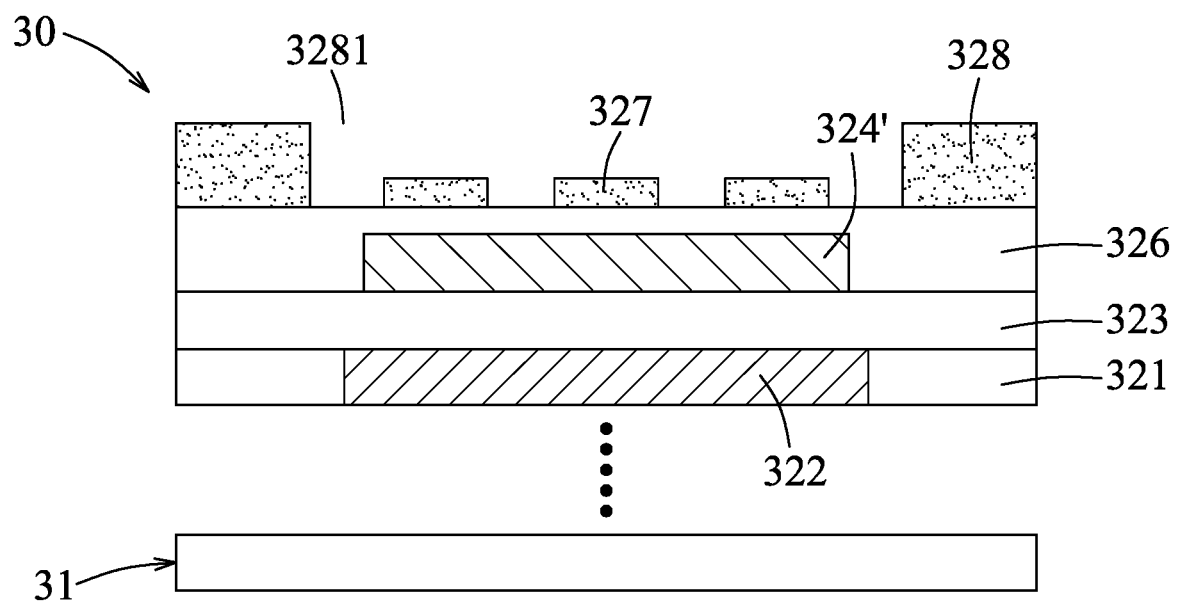

Referring to FIG. 4 and the example illustrated in FIG. 11, the method 100 then proceeds to step 107, where a patterned mask layer is formed on the second dielectric layer. A patterned mask layer 328 is formed on the second dielectric layer 326 using the materials and the processes described above for patterning the mask layer in the formation of the opening in the first dielectric layer 321, and the details thereof are omitted for the sake of brevity. The patterned mask layer 328 is formed with an opening 3281 to expose the patterned sacrificial layer 327 therethrough.

Figure 12:
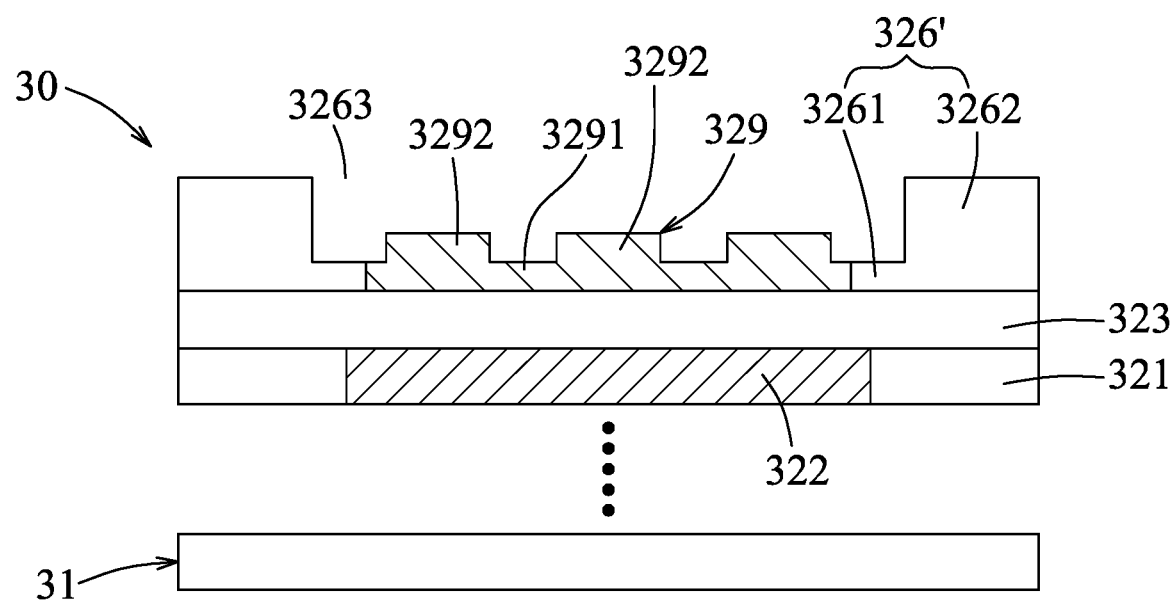
Figure 13:
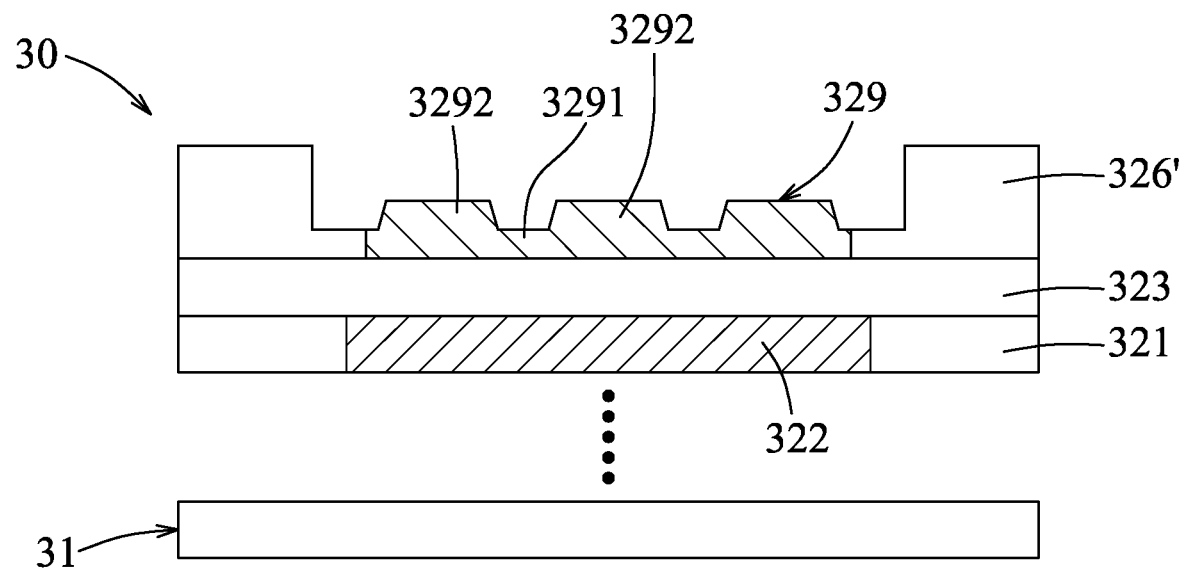

Referring to FIG. 4 and the examples illustrated in FIGS. 11 to 13, the method 100 then proceeds to step 108, where a channel region is formed. A dry etching process is performed to pattern the second dielectric layer 326 and to further pattern the patterned active layer 324' while gradually removing the patterned sacrificial layer 327 and the patterned mask layer 328, so as to form a patterned dielectric layer 326' and a channel region 329 on the high-k gate insulator layer 323. The patterned dielectric layer 326' includes a lower dielectric sub-layer 3261, and an upper dielectric sub-layer 3262 disposed on and integrally formed with the lower dielectric sub-layer 3261. The upper dielectric sub-layer 3262 is formed with an opening 3263. The channel region 329 includes a lower channel portion 3291 and a plurality of upper channel portions 3292 formed integrally with the lower channel portion 3291. The lower channel portion 3291 has a top surface substantially flush with a top surface of the lower dielectric sub-layer 3261. The upper channel portions 3292 are disposed in the opening 3263 of the patterned dielectric layer 326', protrude from the lower channel portion 3291, and are spaced apart from each other. In some embodiments, each of the upper channel portions 3292 is configured to have a substantially rectangular cross-section, as illustrated in FIG. 12. In some alternative embodiments, each of the upper channel portions 3292 is configured to have a substantially trapezoid cross-section, as illustrated in FIG. 13.

Figure 14:
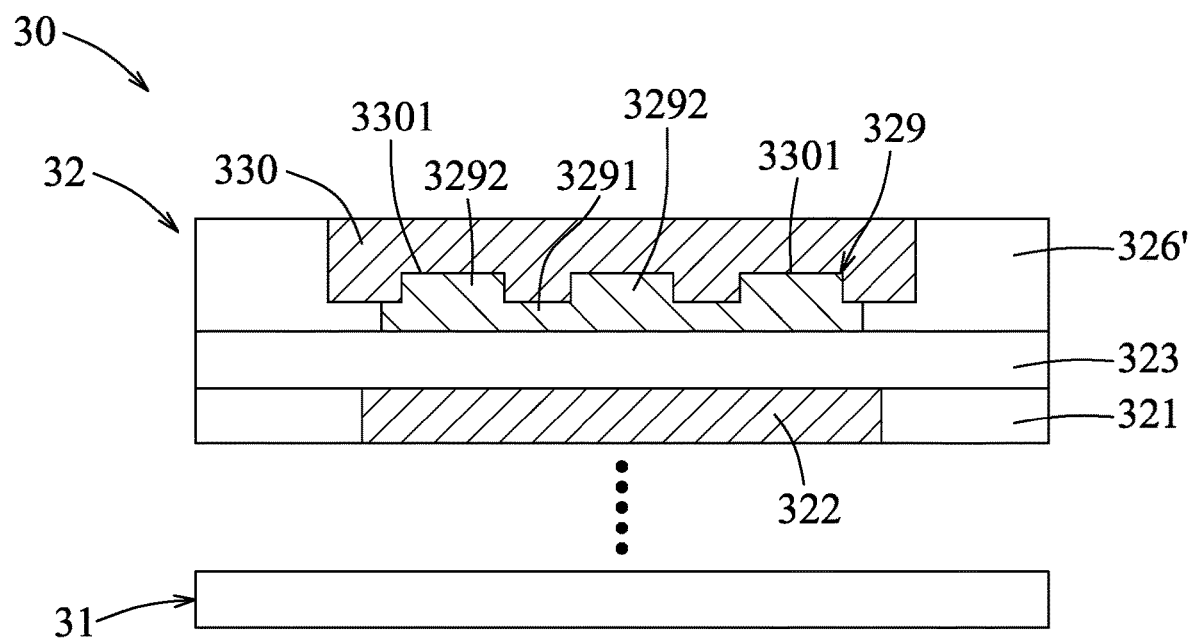

Referring to FIG. 4 and the examples illustrated in FIGS. 12 and 14, the method 100 then proceeds to step 109, where a source/drain electrode is formed. A source/drain electrode 330 is formed in the patterned dielectric layer 326' and on the channel region 329 by depositing a conductive material to fill the opening 3263 and then removing excess of the conductive material over the patterned dielectric layer 326' by a planarization technique (for example, CMP), such that a transistor structure 32 is formed on the substrate 31. In some embodiments, the conductive material may include, for example, but not limited to, polysilicon, doped silicon, a metal silicide material, metal composites (for example, but not limited to, titanium nitride (TiN), tantalum nitride (TaN), tungsten nitride (WN), other metal nitrides, or the like, or combinations thereof), or a metal material (for example, but not limited to, silver, aluminum, copper, zirconium, titanium, tungsten, tantalum, ruthenium, palladium, platinum, cobalt, nickel, or the like, or alloys thereof). Other suitable materials are within the contemplated scope of the present disclosure. Deposition of the conductive material may be performed by a suitable deposition process as is known in the art of semiconductor fabrication, such as PVD, CVD, ALD, PEALD, thermal ALD, PECVD, or the like. Other suitable techniques are within the contemplated scope of the present disclosure.

Figure 15:
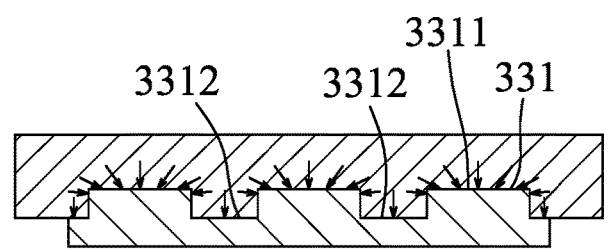
FIG. 15 is a schematic side view illustrating an electric field distribution at an interface of an electrode (for example, a source/drain electrode) and an active layer (a metal oxide layer, for example, a channel region) of the transistor structure of the semiconductor device manufactured by the method as depicted in FIG. 4 in accordance with some embodiments.

Referring to the examples illustrated in FIGS. 14 and 15, the source/drain electrode 330 includes a plurality of depressed regions 3301 depressed inwardly from a bottom surface of the source/drain electrode 330 and are spaced apart from each other. The upper channel portions 3292 of the channel region 329 protrude from the lower channel portion 3291 of the channel regions 329 into the depressed regions 3301 of the source/drain electrode 330, and are respectively fitted into the depressed regions 3301 of the source/drain electrode 330 to be in conformity with the shapes of the depressed regions 3301, such that an uneven interface 331 is formed between the source/drain electrode 330 and the channel region 329. The uneven interface 331 includes a planar region 3311 and a plurality of curved regions 3312 spaced apart from each other and interconnected with each other through the planar region 3311. The curved regions 3312 of the uneven interface 331 are formed between the depressed regions 3301 of the source/drain electrode 330 and the upper channel portions 3292 of the channel region 329, respectively. In some embodiments, the uneven interface 331 is corrugated, such that the planar region 3311 includes a plurality of planar portions disposed to alternate with the curved regions 3312, each of which is configured as a U-shape.

Compared to the planar interface 27 formed between the first or second source/drain electrode 26, 26' and the channel region 25 of the transistor structure 20 as illustrated in FIGS. 2 and 3, a surface area of the uneven interface 331 formed between the source/drain electrode 330 and the channel region 329 of the transistor structure 32 is increased by forming the channel region 329 with a special configuration in which the upper channel portions 3292 protrude from the lower channel portion 3291 and are spaced apart from each other, such that an effective electric field at the uneven interface 331 can be increased. Therefore, the contact resistance at the uneven interface 331 can be reduced and the conductance of the source/drain electrode 330 can be improved, such that the performance of the transistor structure 32 of the semiconductor device 30 can be improved.

Figure 16:
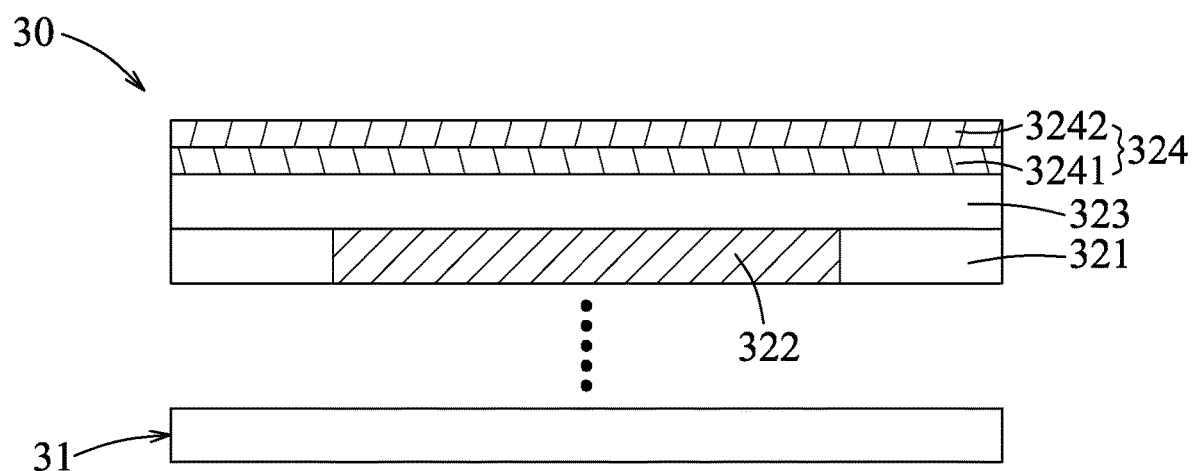
FIGS. 16 to 24 are schematic side views illustrating some intermediate stages of the manufacturing method as depicted in FIG. 4 in accordance with some alternative embodiments.

Referring to FIG. 4 and the example illustrated in FIG. 16, in some alternative embodiments, in step 102 of the method 100, where the high-k gate insulator layer 323 and the active layer 324 are sequentially formed on the first dielectric layer 321 and the gate electrode 322, the active layer (the metal oxide layer) 324 may be formed on the high-k gate insulator layer 323 by depositing a first active sub-layer (a first metal oxide sub-layer) 3241 on the high-k gate insulator layer 323 and depositing a second active sub-layer (a second metal oxide sub-layer) 3242 on the first active sub-layer 3241 using a suitable deposition process as is known in the art of semiconductor fabrication, such as PVD, CVD, ALD, PEALD, thermal ALD, PECVD, or the like, such that the active layer 324 includes the first active sub-layer 3241 disposed on the high-k gate insulator layer 323 and the second active sub-layer 3242 disposed on the first active sub-layer 3241. Other suitable techniques are within the contemplated scope of the present disclosure. In some embodiments, each of the first and second active sub-layers 3241, 3242 may independently include a metal oxide material, for example, but not limited to, indium gallium zinc oxide (InGaZnO, IGZO), tungsten-doped indium oxide (InWO), indium zinc oxide (InZnO), indium tin oxide (InSnO), zinc oxide (ZnO), gallium oxide (GaOx), indium oxide (InOx), aluminum zinc oxide (AZO), or combinations thereof. Other suitable materials are within the contemplated scope of the present disclosure. The second active sub-layer 3242 has a carrier concentration greater than that of the first active sub-layer 3241. In some embodiments, the first active sub-layer 3241 has a carrier concentration ranging from $1.0 \times 10^{13}$ to $1.0 \times 10^{18}$ cm$^{-3}$, and the second active sub-layer 3242 has a carrier concentration ranging from $1.0 \times 10^{13}$ cm$^{-3}$ to $1.0 \times 10^{23}$ cm$^{-3}$. The carrier concentrations of the first and second active sub-layers 3241, 3242 may be controlled independently by tuning the compositions of the metal oxide materials used for forming the first and second active sub-layers 3241, 3242.

Figure 17:
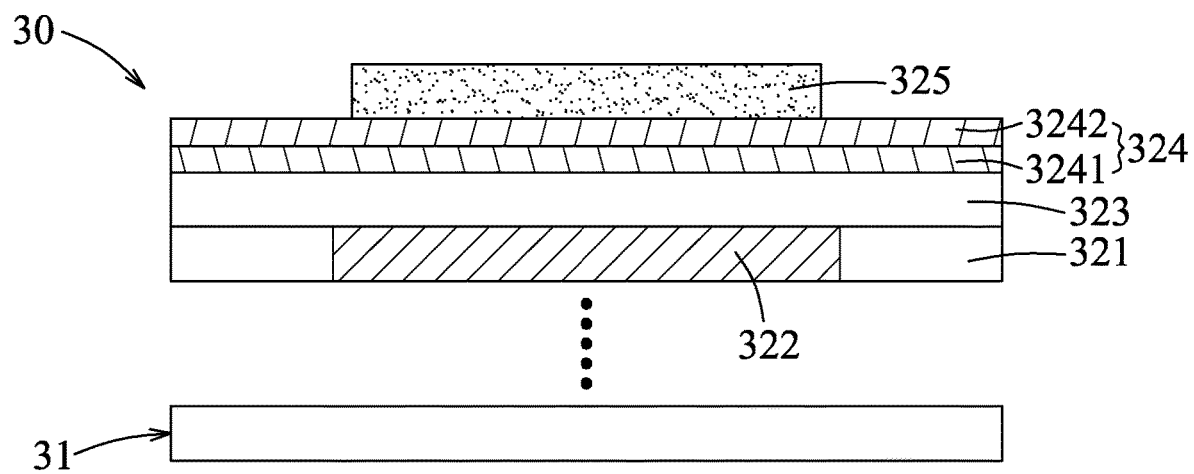

Referring to FIG. 4 and the example illustrated in FIG. 17, in some alternative embodiments, in step 103 of the method 100, where the patterned mask layer 325 is formed on the active layer 324, the patterned mask layer 325 is formed on the second active sub-layer 3242 of the active layer 324 using the materials and the processes described above for patterning the mask layer in the formation of the opening in the first dielectric layer 321 with reference to FIG. 5, and the details thereof are omitted for the sake of brevity.

Figure 18:
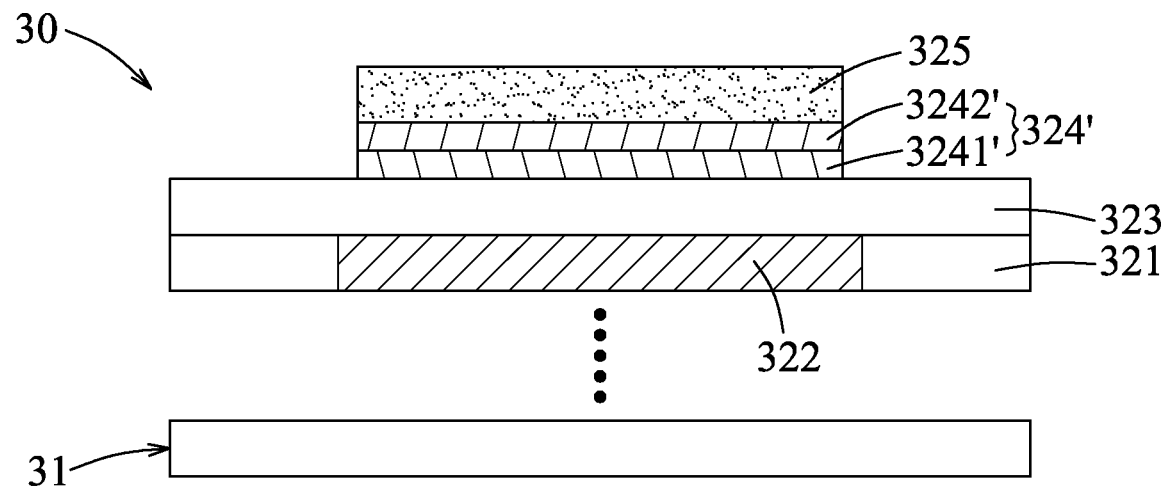
Figure 19:
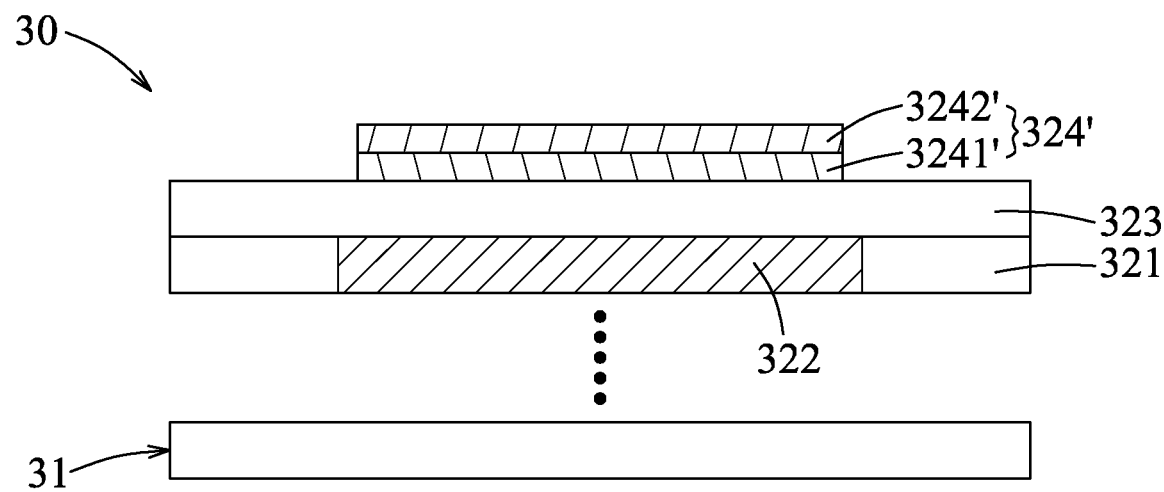

Referring to FIG. 4 and the examples illustrated in FIGS. 17 to 19, in some alternative embodiments, in step 104 of the method 100, where the active layer 324 is patterned to form the patterned active layer 324', the active layer 324, which includes the first and second active sub-layers 3241, 3242, is patterned by sequentially patterning the second active sub-layer 3242 and the first active sub-layer 3241 using the processes described above with reference to FIGS. 7 to 9, and the details of such processes are omitted for the sake of brevity. The patterned active layer 324' thus formed includes a first patterned active sub-layer 3241' disposed on the high-k gate insulator layer 323 and a second patterned active sub-layer 3242' disposed on the first patterned active sub-layer 3241'.

Figure 20:
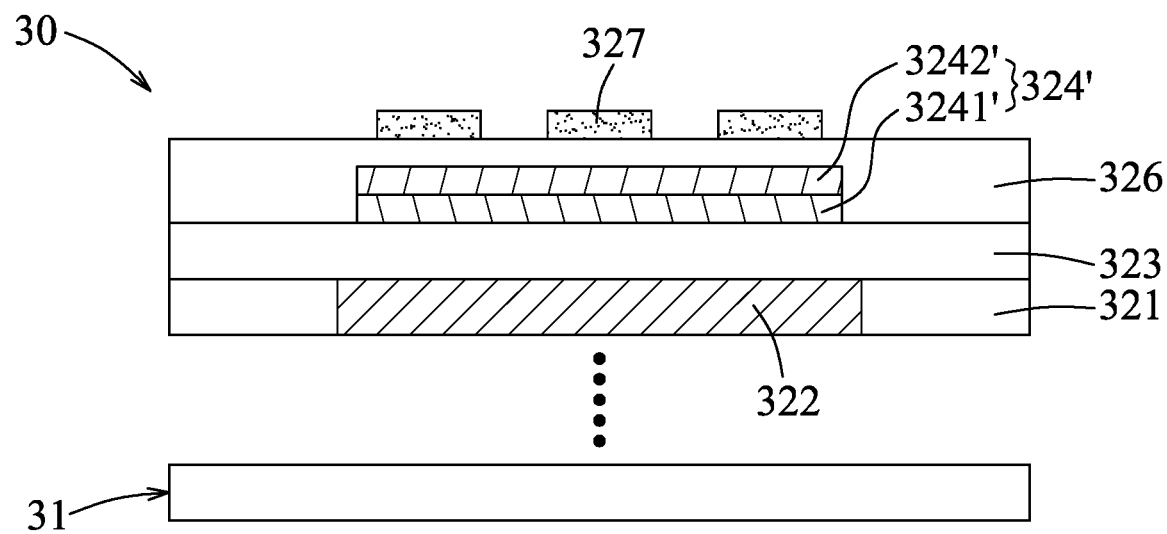

Referring to FIG. 4 and the example illustrated in FIG. 20, in some alternative embodiments, in steps 105, 106 of the method 100, where the second dielectric layer 326 and the patterned sacrificial layer 327 are formed, respectively, the second dielectric layer 326 is formed on the high-k gate insulator layer 323 to cover the first and second active sub-layers 3241, 3242, and the patterned sacrificial layer 327 are formed on the second dielectric layer 326 in a position corresponding to those of the first and second active sub-layers 3241, 3242. The materials and the processes for forming the second dielectric layer 326 and the patterned sacrificial layer 327 are the same as or similar to those described above for forming the second dielectric layer 326 and the patterned sacrificial layer 327 with reference to FIG. 10, and the details thereof are omitted for the sake of brevity.

Figure 21:
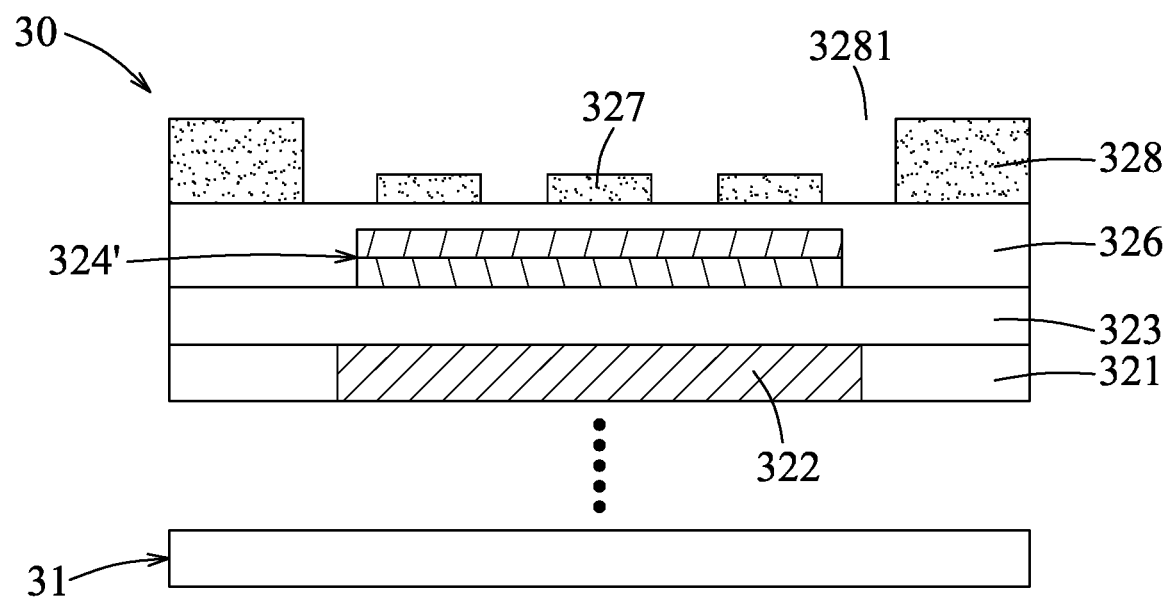

Referring to FIG. 4 and the example illustrated in FIG. 21, in some alternative embodiments, in step 107 of the method 100, where the patterned mask layer 328 is formed on the second dielectric layer 326, the patterned mask layer 328 is formed on the second dielectric layer 326 using the materials and the processes described above for patterning the mask layer in the formation of the recess in the first dielectric layer 321, and the details thereof are omitted for the sake of brevity. The patterned sacrificial layer 327 is exposed from the opening 3281 of the patterned mask layer 328.

Figure 22:
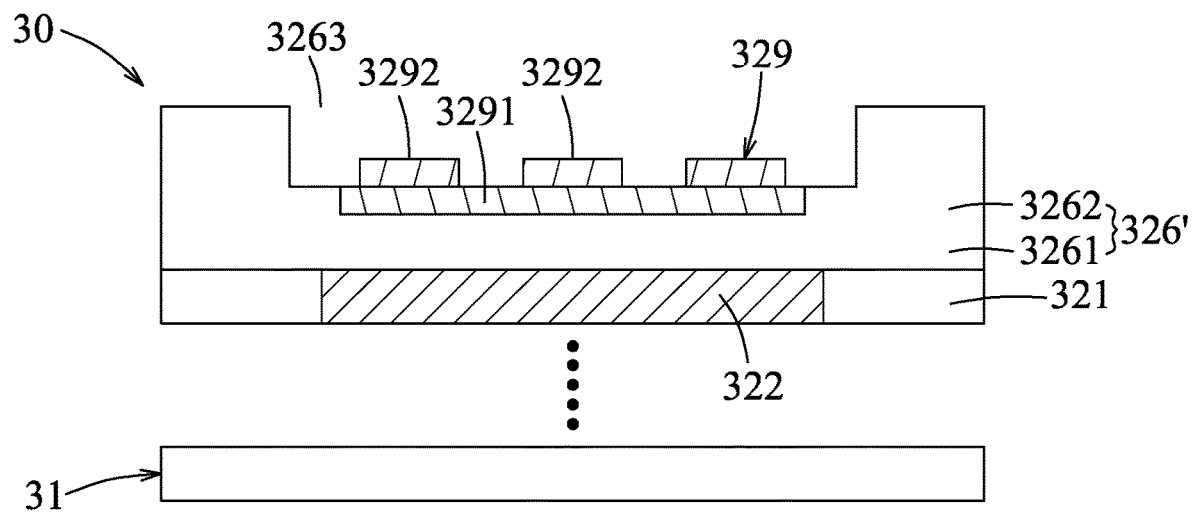
Figure 23:
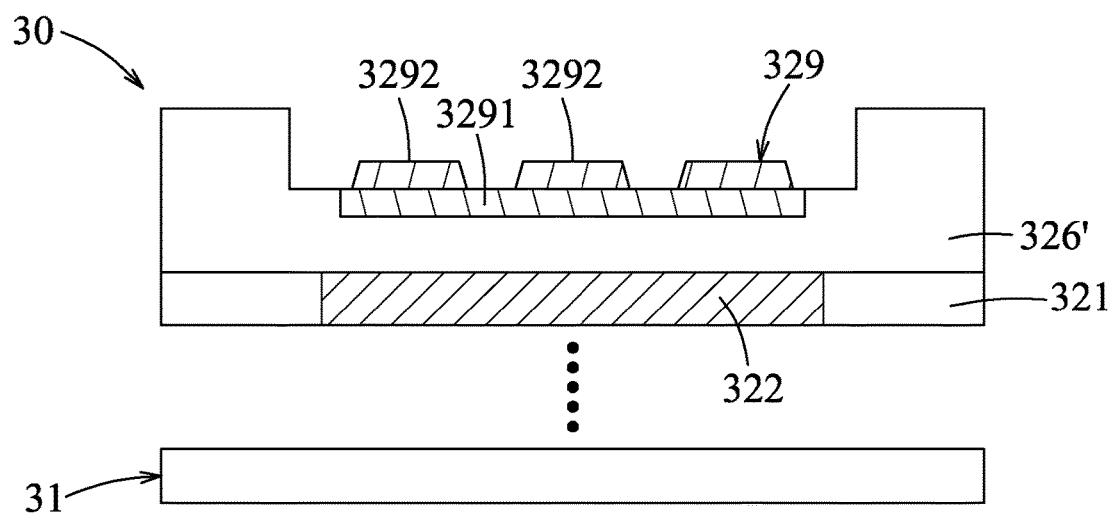

Referring to FIG. 4 and the examples illustrated in FIGS. 21 to 23, in some alternative embodiments, in step 108 of the method 100, where the channel region 329 is formed, a dry etching process is performed to pattern the second dielectric layer 326 and the second patterned active sub-layer 3242' of the patterned active layer 324' so as to form the patterned dielectric layer 326' and the channel region 329. The patterned dielectric layer 326' includes the lower dielectric sub-layer 3261 and the upper dielectric sub-layer 3262 disposed on and formed integrally with the lower dielectric sub-layer 3261. The upper dielectric sub-layer 3262 is formed with the opening 3263. The channel region 329 includes the lower channel portion 3291 and plurality of the upper channel portions 3292 formed integrally with the lower channel portion 3291. In some alternative embodiments, the upper channel portions 3292 are formed from the upper patterned active sub-layer 3242' by a dry-etching process. In some embodiments, the lower channel portion 3291 is formed from the first patterned active sub-layer 3241', and the upper channel portions 3292 are formed from the second patterned active sub-layer 3242', such that the upper channel portions 3292 have a carrier concentration greater than that of the lower channel portion 3291. In some embodiments, the lower channel portion 3291 has a carrier concentration ranging from $1.0 \times 10^{13}$ to $1.0 \times 10^{18}$ cm$^{-3}$, and the upper channel portions 3292 have a carrier concentration ranging from $1.0 \times 10^{13}$ cm$^{-3}$ to $1.0 \times 10^{23}$ cm$^{-3}$. In some embodiments, each of the upper channel portions 3292 is configured to have a substantially rectangular cross-section, as illustrated in FIG. 22. In some alternative embodiments, each of the upper channel portions 3292 is configured to have a substantially trapezoid cross-section, as illustrated in FIG. 23.

Figure 24:
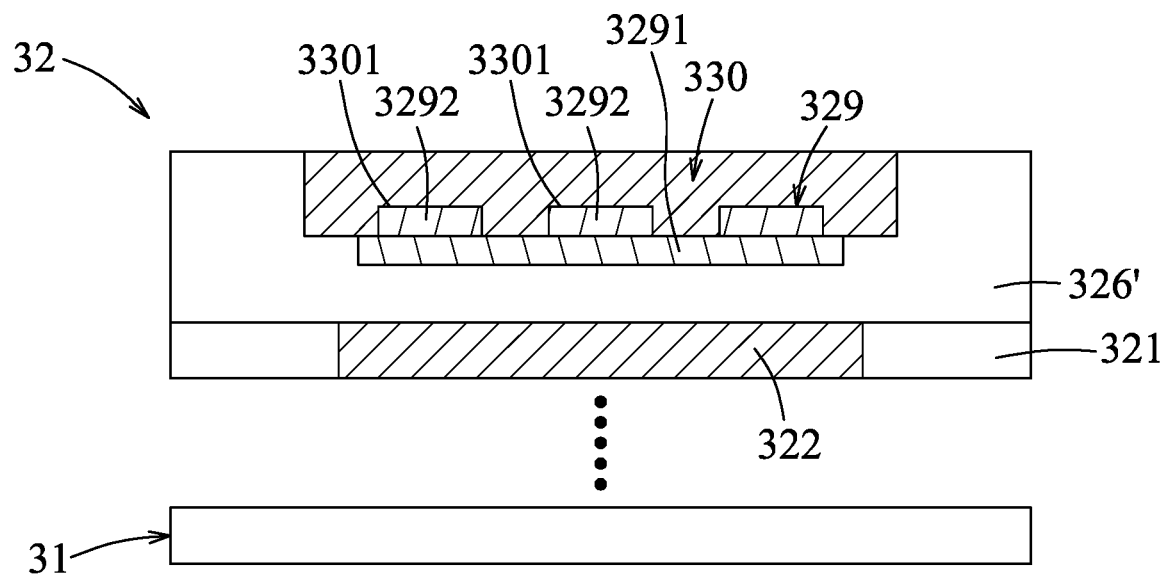

Referring to FIG. 4 and the examples illustrated in FIGS. 22 and 24, in some alternative embodiments, in step 109 of the method 100, where the source/drain electrode 330 is formed, the source/drain electrode 330 is formed using the conductive material and the processes described above for forming the source/drain electrode 330 with reference to FIG. 14, and the details thereof are omitted for the sake of brevity. The upper channel portions 3292 of the channel region 329, which are formed from the upper patterned active sub-layer 3242', are respectively fitted into the depressed regions 3301 of the source/drain electrode 330 to be in conformity with the shapes of depressed regions 3301.

Figure 25:
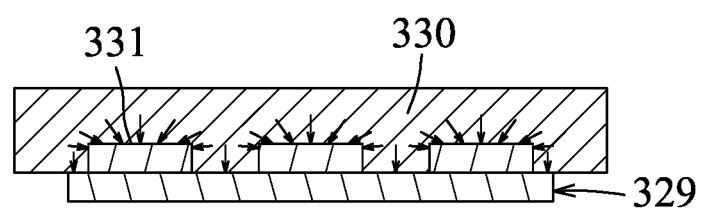
FIG. 25 is a schematic side view illustrating an electric field distribution at an interface of an electrode (for example, a source/drain electrode) and an active layer (a metal oxide layer, for example, a channel region) of the transistor structure of the semiconductor device manufactured by the method as depicted in FIG. 4 in accordance with some alternative embodiments.

Referring to the examples illustrated in FIGS. 24 and 25, in some alternative embodiments, in addition to having the uneven interface 331 formed between the source/drain electrode 330 and the channel region 329 of the transistor structure 32, the upper channel portions 3292 of the channel region 329 are formed from the upper patterned active sub-layer 3242' having a carrier concentration that is relatively greater compared with the carrier concentration of the lower patterned active sub-layer 3241' for forming the lower channel portion 3291 of the channel region 329. Therefore, the contact resistance at the interface 331 can be further reduced and the conductance of the source/drain electrode 330 can be further improved.

In a transistor structure of a semiconductor device of the present disclosure, a surface area of an interface formed between a source/drain electrode and a channel region of the transistor structure is increased by forming the channel region with a special configuration, in which upper channel portions of the channel region protrude from a lower channel portion of the channel region and are spaced apart from each other, such that an effective electric field at the interface between the source/drain electrode and the channel region of the transistor structure can be increased. Therefore, the contact resistance at the interface can be reduced and the conductance of the source/drain electrode can be improved, such that the performance of the transistor structure of the semiconductor device can be improved. In addition, the upper channel portions of the channel region may be formed from a metal oxide material having a carrier concentration that is relatively greater compared with the carrier concentration of a metal oxide material used for forming the lower channel portion of the channel region. Therefore, the contact resistance at the interface between the source/drain electrode and the channel region can be further reduced and the conductance of the source/drain electrode can be further improved.

In accordance with some embodiments of the present disclosure, a semiconductor device includes a substrate and a transistor structure disposed on the substrate. The transistor structure includes a channel region and a source/drain electrode, which is disposed on the channel region to form an uneven interface between the channel region and the source/drain electrode.

In accordance with some embodiments of the present disclosure, the uneven interface includes a planar region, and a plurality of curved regions spaced apart from each other and interconnected with each other through the planar region.

In accordance with some embodiments of the present disclosure, the uneven interface is corrugated such that the planar region includes a plurality of planar portions disposed to alternate with the curved regions, each of which is configured as a U-shape.

In accordance with some embodiments of the present disclosure, the source/drain electrode includes a plurality of depressed regions spaced apart from each other, and the channel region includes a lower channel portion and a plurality of upper channel portions, which protrude from the lower channel portion and which are spaced apart from each other.

In accordance with some embodiments of the present disclosure, the upper channel portions of the channel region are respectively fitted into the depressed regions of the source/drain electrode to be in conformity with the shapes of the depressed regions, such that the curved regions of the uneven interface are formed between the depressed regions of the source/drain electrode and the upper channel portions of the channel region, respectively.

In accordance with some embodiments of the present disclosure, the upper channel portions have a carrier concentration greater than that of the lower channel portion.

In accordance with some embodiments of the present disclosure, the lower channel portion has a carrier concentration ranging from $1.0 \times 10^{13}$ to $1.0 \times 10^{18}$ cm$^{-3}$, and the upper channel portions have a carrier concentration ranging from $1.0 \times 10^{13}$ cm$^{-3}$ to $1.0 \times 10^{23}$ cm$^{-3}$.

In accordance with some embodiments of the present disclosure, a semiconductor device includes a substrate and a transistor structure disposed on the substrate. The transistor structure includes a channel region and a source/drain electrode disposed on the channel region. The channel region includes a lower channel portion and a plurality of upper channel portions protruding from the lower channel portion into the source/drain electrode.

In accordance with some embodiments of the present disclosure, the source/drain electrode includes a plurality of depressed regions spaced apart from each other, and the upper channel portions of the channel region are respectively fitted into the depressed regions of the source/drain electrode to be in conformity with the shapes of the depressed regions.

In accordance with some embodiments of the present disclosure, the upper channel portions have a carrier concentration greater than that of the lower channel portion.

In accordance with some embodiments of the present disclosure, the lower channel portion has a carrier concentration ranging from $1.0\times10^{13}$ to $1.0\times10^{18}$ cm$^{-3}$, and the upper channel portions have a carrier concentration ranging from $1.0\times10^{13}$ cm$^{-3}$ to $1.0\times10^{23}$ cm$^{-3}$.

In accordance with some embodiments of the present disclosure, each of the upper channel portions is configured to have a rectangular cross-section.

In accordance with some embodiments of the present disclosure, each of the upper channel portions is configured to have a trapezoid cross-section.

In accordance with some embodiments of the present disclosure, a method for manufacturing a semiconductor device includes: forming a gate electrode on a substrate; forming a high-k insulator layer on the gate electrode; forming a patterned active layer on the high-k insulator layer; further patterning the patterned active layer to form a channel region, which includes a lower channel portion and a plurality of upper channel portions protruding from the lower channel portion and spaced apart from each other; and forming a source/drain electrode on the channel region, such that upper channel portions of the channel region protrude into the source/drain electrode to form an uneven interface between the channel region and the source/drain electrode.

In accordance with some embodiments of the present disclosure, further patterning of the patterned active layer includes: forming a patterned sacrificial layer on the patterned active layer, and further patterning the patterned active layer through the patterned sacrificial layer while removing the patterned sacrificial layer by a dry etching process.

In accordance with some embodiments of the present disclosure, further patterning of the patterned active layer further includes: forming a dielectric layer on the high-k gate insulator layer to cover the patterned active layer; forming a patterned mask layer on the dielectric layer, the patterned mask layer being formed with an opening to expose the patterned sacrificial layer therethrough; and patterning the dielectric layer through the patterned mask layer and removing the patterned mask layer by the dry etching process while further patterning the patterned active layer and removing the patterned sacrificial layer.

In accordance with some embodiments of the present disclosure, formation of the patterned active layer includes: depositing a first active sub-layer on the high-k gate insulator layer; depositing a second active sub-layer on the first active sub-layer; and sequentially patterning the second active sub-layer and the first active sub-layer to form the patterned active layer, which includes a first patterned active sub-layer disposed on the high-k gate insulator layer and a second patterned active sub-layer disposed on the first patterned active sub-layer.

In accordance with some embodiments of the present disclosure, further patterning of the patterned active layer includes: forming a patterned sacrificial layer on the patterned active layer, and further patterning the patterned active layer through the patterned sacrificial layer to pattern the second patterned active sub-layer while removing the patterned sacrificial layer by a dry etching process.

In accordance with some embodiments of the present disclosure, the second active sub-layer has a carrier concentration greater than that of the first active sub-layer.

In accordance with some embodiments of the present disclosure, the first active sub-layer has a carrier concentration ranging from $1.0\times10^{13}$ to $1.0\times10^{18}$ cm$^{-3}$, and the second active sub-layer has a carrier concentration ranging from $1.0\times10^{13}$ cm$^{-3}$ to $1.0\times10^{23}$ cm$^{-3}$.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a gate electrode on a substrate;
    forming a high-k insulator layer on the gate electrode;
    forming a patterned active layer on the high-k insulator layer;
    further patterning the patterned active layer to form a channel region, which includes a lower channel portion and a plurality of upper channel portions protruding from the lower channel portion and spaced apart from each other; and
    forming a source/drain electrode on the channel region, such that upper channel portions of the channel region protrude into the source/drain electrode to form an uneven interface between the channel region and the source/drain electrode,
    wherein further patterning of the patterned active layer includes:
        forming a patterned sacrificial layer on the patterned active layer; and
        further patterning the patterned active layer through the patterned sacrificial layer while removing the patterned sacrificial layer by a dry etching process.

2. The method according to claim 1, wherein further patterning of the patterned active layer further includes:
    forming a dielectric layer on the high-k gate insulator layer to cover the patterned active layer;
    forming a patterned mask layer on the dielectric layer, the patterned mask layer being formed with an opening to expose the patterned sacrificial layer therethrough; and
    patterning the dielectric layer through the patterned mask layer and removing the patterned mask layer by the dry etching process while further patterning the patterned active layer and removing the patterned sacrificial layer.

3. The method according to claim 1, wherein formation of the patterned active layer includes:
    depositing a first active sub-layer on the high-k gate insulator layer;
    depositing a second active sub-layer on the first active sub-layer; and
    sequentially patterning the second active sub-layer and the first active sub-layer to form the patterned active layer including a first patterned active sub-layer disposed on the high-k gate insulator layer and a second patterned active sub-layer disposed on the first patterned active sub-layer.

4. The method according to claim 3, wherein further patterning of the patterned active layer includes:
   forming a patterned sacrificial layer on the patterned active layer; and
   further patterning the patterned active layer through the patterned sacrificial layer to pattern the second patterned active sub-layer while removing the patterned sacrificial layer by a dry etching process.

5. The method according to claim 3, wherein the second active sub-layer has a carrier concentration greater than a carrier concentration of the first active sub-layer.

6. The method according to claim 5, wherein the first active sub-layer has a carrier concentration ranging from $1.0\times10^{13}$ to $1.0\times10^{18}$ cm$^{-3}$, and the second active sub-layer has a carrier concentration ranging from $1.0\times10^{13}$ cm$^{-3}$ to $1.0\times10^{23}$ cm$^{-3}$.

7. The method according to claim 4, wherein further patterning of the patterned active layer further includes:
   forming a dielectric layer on the high-k gate insulator layer to cover the patterned active layer;
   forming a patterned mask layer on the dielectric layer, the patterned mask layer being formed with an opening to expose the patterned sacrificial layer therethrough; and
   patterning the dielectric layer through the patterned mask layer and removing the patterned mask layer by the dry etching process while patterning the second patterned active sub-layer and removing the patterned sacrificial layer.

8. The method according to claim 1, wherein formation of the patterned active layer includes:
   forming an active layer on the high-k insulator layer;
   forming a patterned mask layer on the active layer; and
   patterning the active layer through the patterned mask layer using a dry etching process to remove the patterned mask layer while patterning the active layer.

9. A method for manufacturing a semiconductor device, comprising:
   forming a gate electrode in a first dielectric layer disposed on a substrate;
   forming a high-k insulator layer on the first dielectric layer and the gate electrode;
   forming a patterned active layer on the high-k insulator layer;
   further patterning the patterned active layer to form a channel region, which includes a lower channel portion and a plurality of upper channel portions protruding from the lower channel portion and spaced apart from each other; and
   forming a source/drain electrode on the channel region, such that upper channel portions of the channel region protrude into the source/drain electrode to form an uneven interface between the channel region and the source/drain electrode.

10. The method according to claim 9, wherein further patterning of the patterned active layer includes:
    forming a patterned sacrificial layer on the patterned active layer; and
    further patterning the patterned active layer while removing the patterned sacrificial layer by a dry etching process.

11. The method according to claim 10, wherein further patterning of the patterned active layer further includes:

forming a second dielectric layer on the high-k gate insulator layer to cover the patterned active layer, such that the patterned sacrificial layer is disposed on the second dielectric layer in a position corresponding to a position of the patterned active layer;
forming a patterned mask layer on the second dielectric layer, the patterned mask layer being formed with an opening to expose the patterned sacrificial layer therethrough; and
patterning the second dielectric layer through the patterned mask layer and removing the patterned mask layer by the dry etching process while further patterning the patterned active layer and removing the patterned sacrificial layer.

12. The method according to claim 9, wherein formation of the patterned active layer includes:
    depositing a first active sub-layer on the high-k gate insulator layer;
    depositing a second active sub-layer on the first active sub-layer, the second active sub-layer having a carrier concentration greater than a carrier concentration of the first active sub-layer; and
    sequentially patterning the second active sub-layer and the first active sub-layer to form the patterned active layer including a first patterned active sub-layer disposed on the high-k gate insulator layer and a second patterned active sub-layer disposed on the first patterned active sub-layer.

13. The method according to claim 12, wherein further patterning of the patterned active layer includes:
    forming a patterned sacrificial layer on the patterned active layer; and
    further patterning the patterned active layer through the patterned sacrificial layer to pattern the second patterned active sub-layer while removing the patterned sacrificial layer by a dry etching process.

14. The method according to claim 13, wherein further patterning of the patterned active layer further includes:
    forming a second dielectric layer on the high-k gate insulator layer to cover the patterned active layer, such that the patterned sacrificial layer is disposed on the second dielectric layer in a position corresponding to a position of the patterned active layer;
    forming a patterned mask layer on the second dielectric layer, the patterned mask layer being formed with an opening to expose the patterned sacrificial layer therethrough; and
    patterning the second dielectric layer through the patterned mask layer and removing the patterned mask layer by the dry etching process while patterning the second patterned active sub-layer and removing the patterned sacrificial layer.

15. A method for manufacturing a semiconductor device, comprising:
    forming a first dielectric layer on a substrate;
    forming a gate electrode in the first dielectric layer;
    forming a high-k insulator layer on first dielectric layer and the gate electrode;
    forming a patterned active layer on the high-k insulator layer;
    further patterning the patterned active layer to form a channel region, which includes a lower channel portion and a plurality of upper channel portions protruding from the lower channel portion and spaced apart from each other; and
    forming a source/drain electrode on the channel region, the source/drain electrode including a plurality of depressed regions spaced apart from each other such that upper channel portions of the channel region are respectively fitted into the depressed regions of the source/drain electrode to be in conformity with the shapes of the depressed regions.

16. The method according to claim 15, wherein further patterning of the patterned active layer includes:
forming a patterned sacrificial layer on the patterned active layer; and
further patterning the patterned active layer through the patterned sacrificial layer while removing the patterned sacrificial layer by a dry etching process.

17. The method according to claim 16, wherein further patterning of the patterned active layer further includes:
forming a second dielectric layer on the high-k gate insulator layer to cover the patterned active layer, such that the patterned sacrificial layer is disposed on the second dielectric layer in a position corresponding to a position of the patterned active layer;
forming a patterned mask layer on the second dielectric layer, the patterned mask layer being formed with an opening to expose the patterned sacrificial layer therethrough; and
patterning the second dielectric layer through the patterned mask layer and removing the patterned mask layer by the dry etching process while further patterning the patterned active layer and removing the patterned sacrificial layer, so as to form a patterned dielectric layer and the channel region on the high-k insulator layer.

18. The method according to claim 15, wherein formation of the patterned active layer includes:
depositing a first active sub-layer on the high-k gate insulator layer;
depositing a second active sub-layer on the first active sub-layer, the second active sub-layer having a carrier concentration greater than a carrier concentration of the first active sub-layer; and
sequentially patterning the second active sub-layer and the first active sub-layer to form the patterned active layer including a first patterned active sub-layer disposed on the high-k gate insulator layer and a second patterned active sub-layer disposed on the first patterned active sub-layer.

19. The method according to claim 18, wherein further patterning of the patterned active layer includes:
forming a patterned sacrificial layer on the patterned active layer; and
further patterning the patterned active layer through the patterned sacrificial layer to pattern the second patterned active sub-layer while removing the patterned sacrificial layer by a dry etching process.

20. The method according to claim 1, wherein formation of the patterned active layer includes:
forming an active layer on the high-k insulator layer;
forming a patterned mask layer on the active layer;
patterning the active layer through the patterned mask layer using a wet etching process to form the patterned active layer disposed below the patterned mask layer; and
removing the patterned mask layer.

* * * * *